(12) United States Patent
Wahl et al.

(10) Patent No.: US 8,759,904 B2
(45) Date of Patent: Jun. 24, 2014

(54) ELECTRONIC DEVICE HAVING PLURAL FIN-FETS WITH DIFFERENT FIN HEIGHTS AND PLANAR FETS ON THE SAME SUBSTRATE

(75) Inventors: Jeremy A. Wahl, Delmar, NY (US); Kingsuk Maitra, Guilderland, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 231 days.

(21) Appl. No.: 13/217,061

(22) Filed: Aug. 24, 2011

(65) Prior Publication Data

US 2013/0049136 A1 Feb. 28, 2013

(51) Int. Cl.
*H01L 27/088* (2006.01)

(52) U.S. Cl.
CPC .................................. *H01L 27/0886* (2013.01)
USPC ..... 257/328; 257/350; 257/390; 257/E29.259

(58) Field of Classification Search
CPC ......................... H01L 27/0886; H01L 29/7855
USPC .................................................. 257/E27.029
See application file for complete search history.

(56) References Cited

U.S. PATENT DOCUMENTS

| 6,911,383 | B2* | 6/2005 | Doris et al. | 438/588 |
| 7,456,055 | B2* | 11/2008 | Orlowski et al. | 438/157 |
| 7,638,843 | B2* | 12/2009 | Xiong et al. | 257/347 |
| 2008/0230852 | A1* | 9/2008 | Yu et al. | 257/401 |
| 2009/0057846 | A1* | 3/2009 | Doyle et al. | 257/623 |

* cited by examiner

*Primary Examiner* — Stephen W Smoot
(74) *Attorney, Agent, or Firm* — Ingrassia Fisher & Lorenz, P.C.

(57) ABSTRACT

Electronic devices (20, 20') of superior design flexibility that avoid channel-width quantization effects common with prior art fin-type (FIN) field effect transistors (FIN-FETS) (22) are obtained by providing multiple FIN-FETs (22) and at least one planar FET (32, 32') on a common substrate (21), wherein the multiple FIN-FETs (22) have fins (231, 232) of at least fin heights H1 and H2, with H2<H1. The multiple FIN-FETs (22) and the at least one planar FET (32, 32') are separated vertically as well as laterally, which aids electrical isolation therebetween. Such electrical isolation can be enhanced by forming the planar FET (32) in a semiconductor region (441) insulated from the common substrate (21). In a preferred embodiment, the multiple height fins (231, 232) are obtained by first forming all fins (231, 232') of common height H1 and then shortening some of the fins (232) to height H2<H1 by differentially etching upper portions thereof that have, preferably, been implanted with etch rate altering ions.

17 Claims, 12 Drawing Sheets

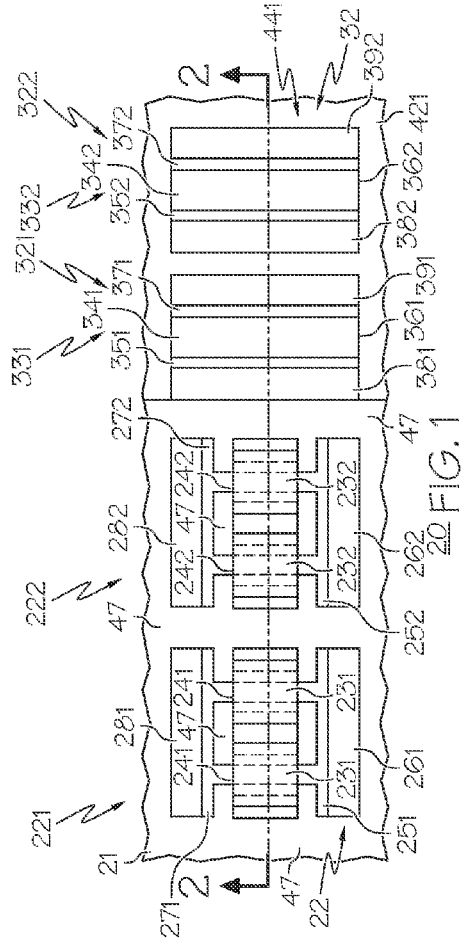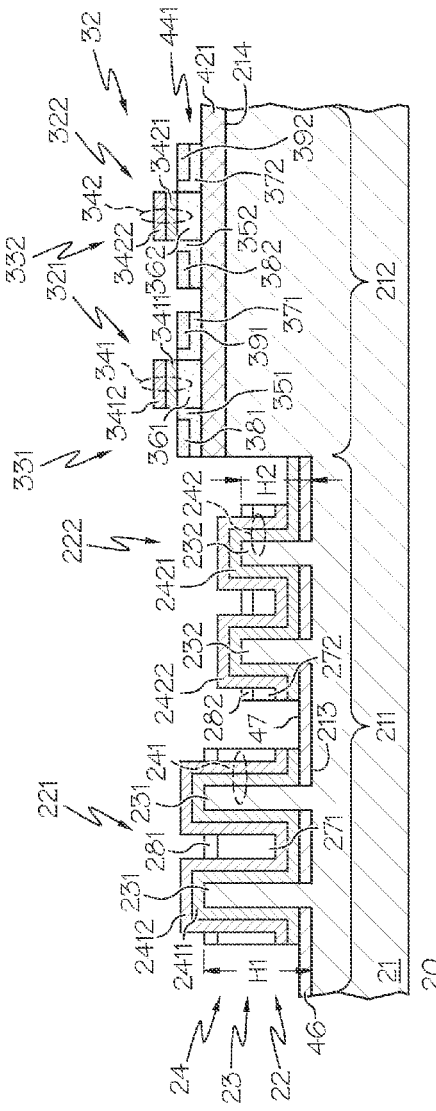

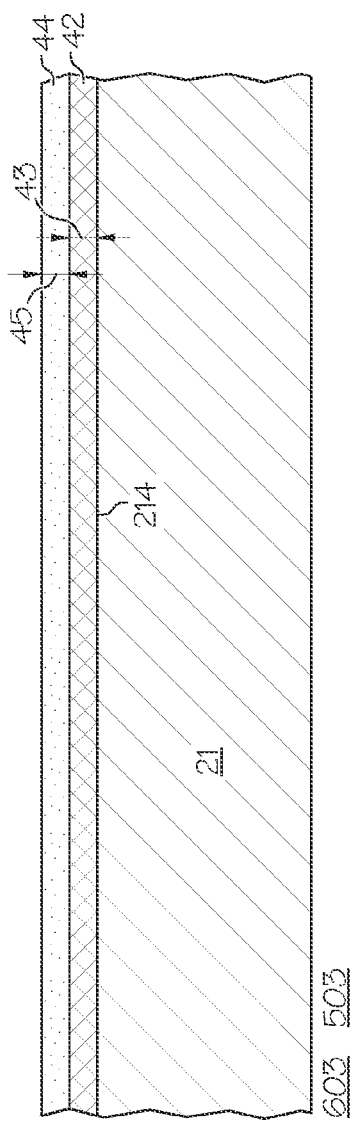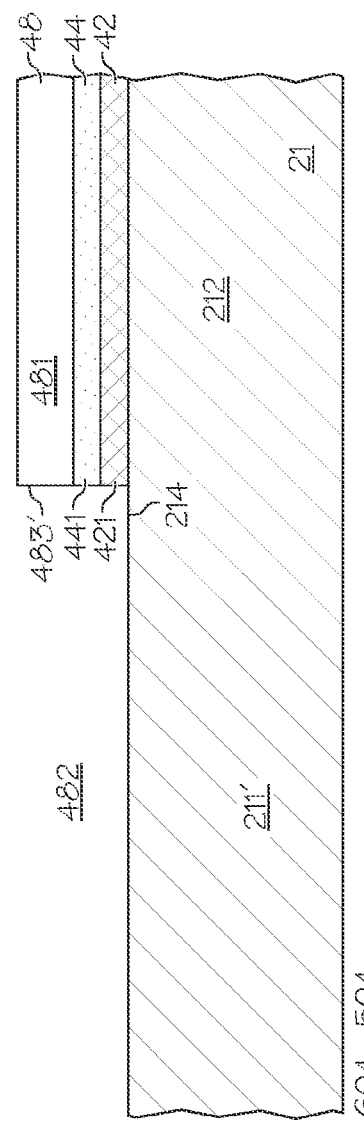
FIG. 3
FIG. 4

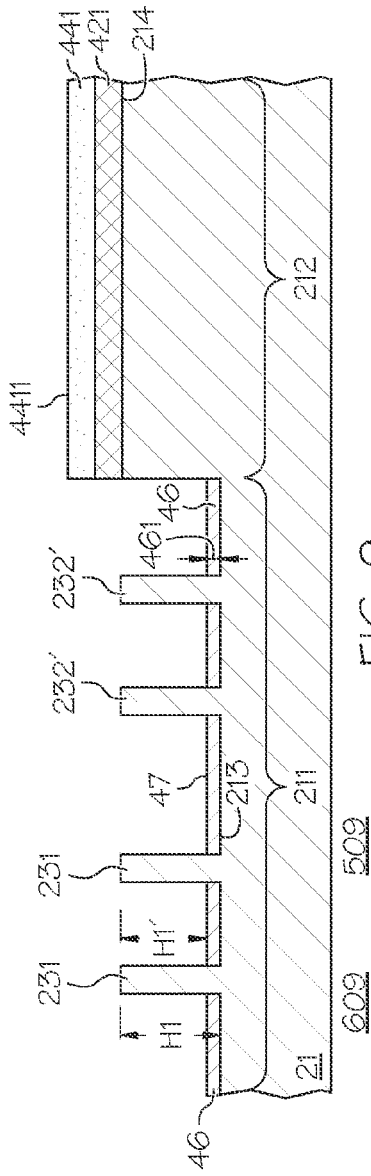
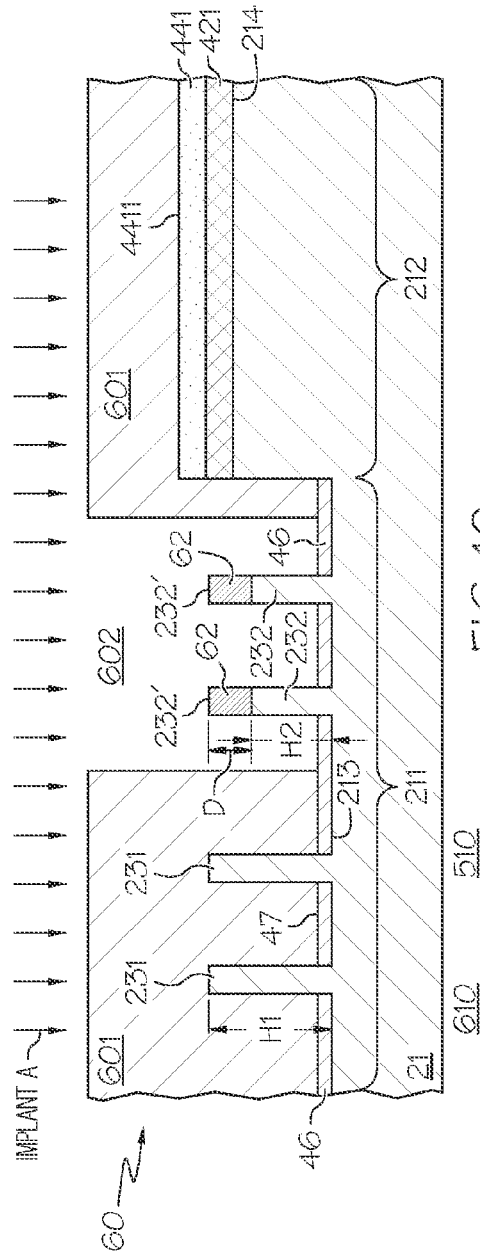

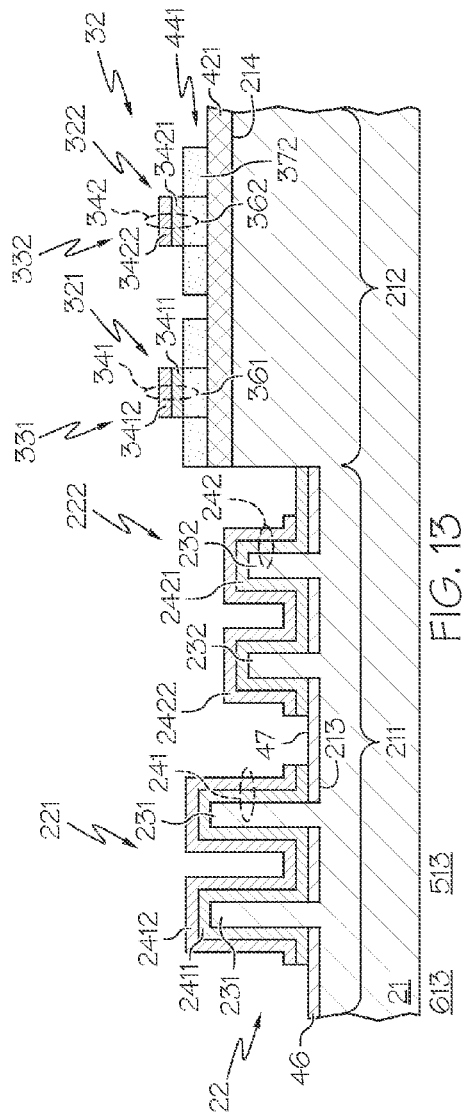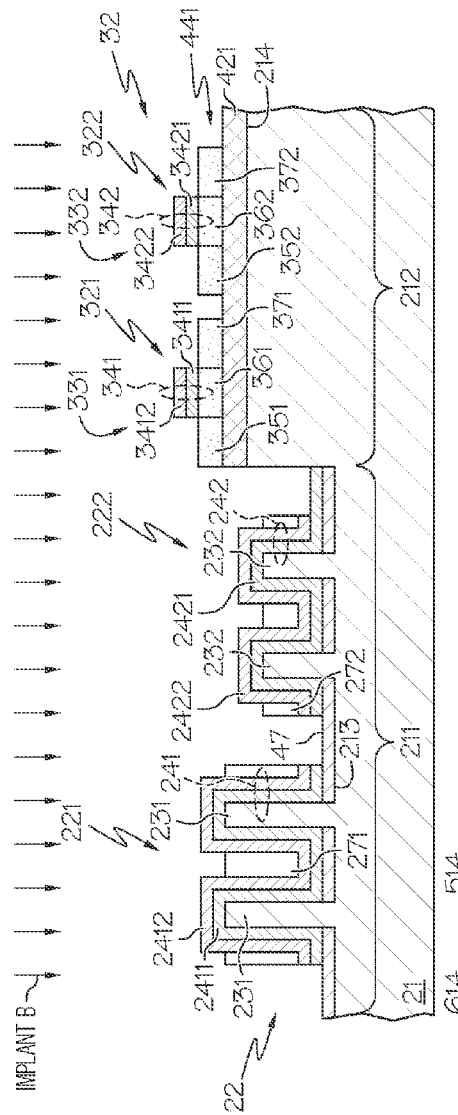

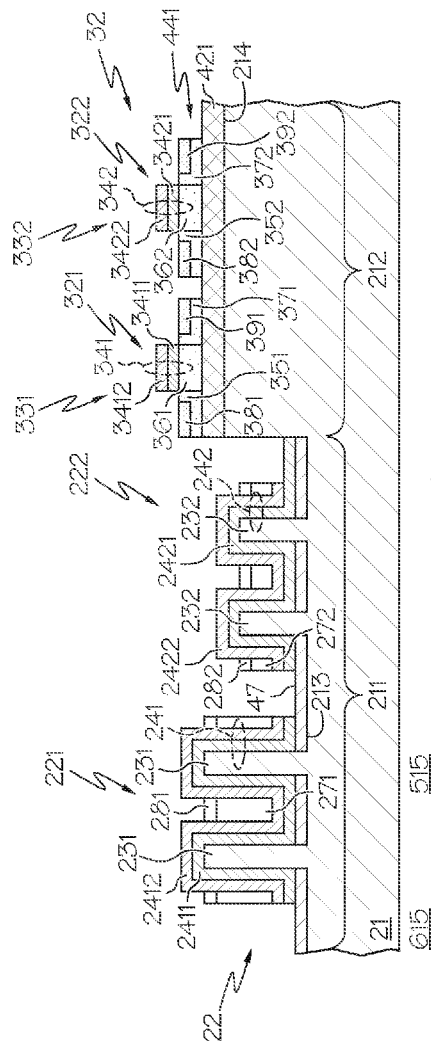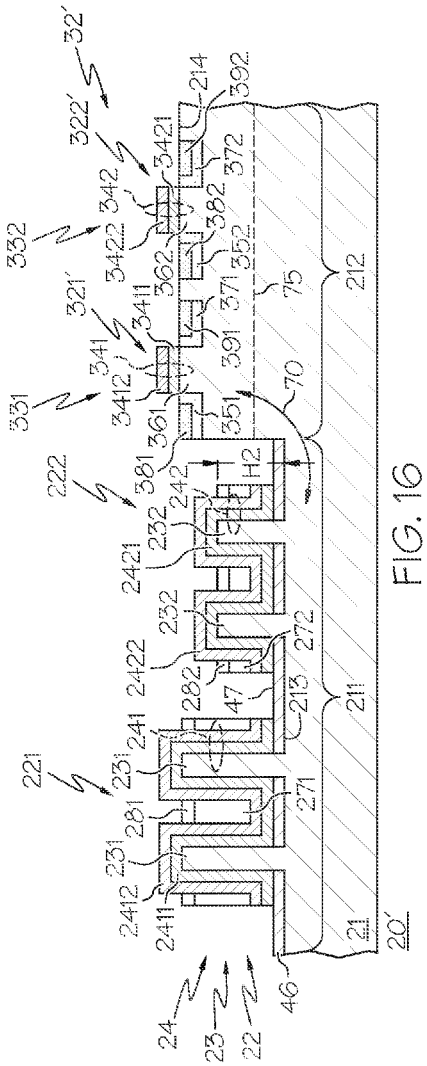

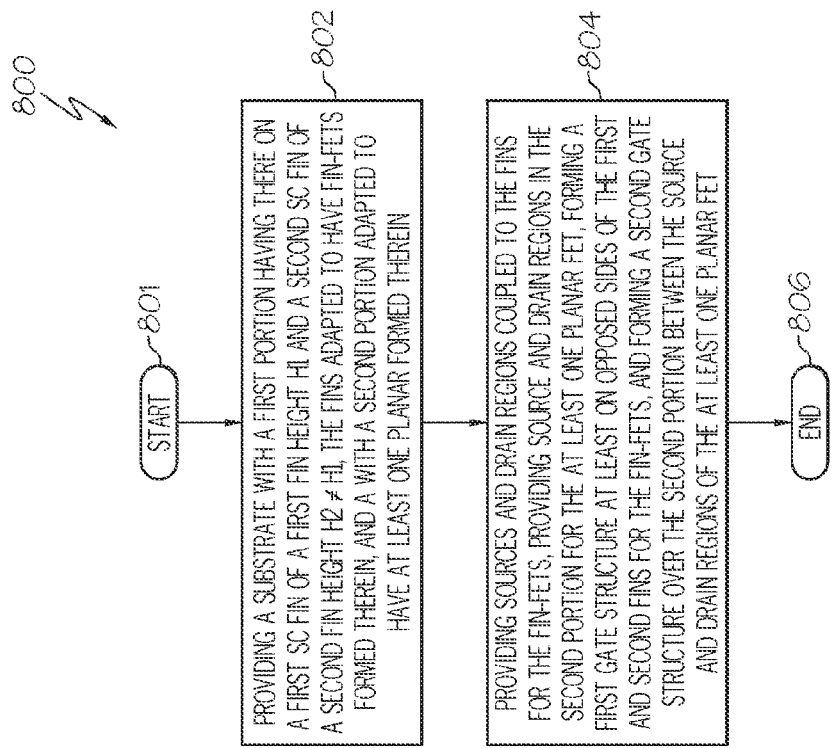

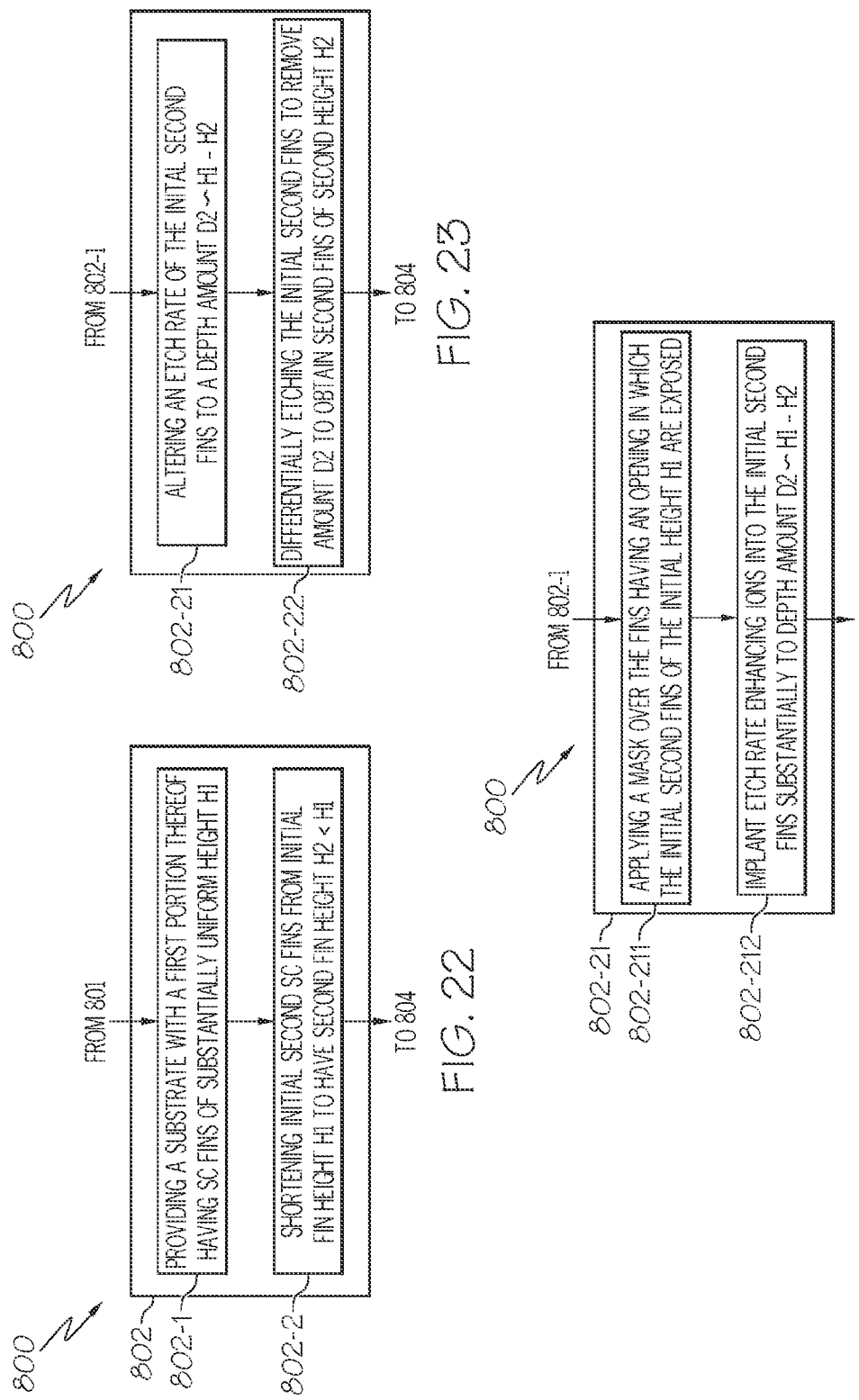

ELECTRONIC DEVICE HAVING PLURAL FIN-FETS WITH DIFFERENT FIN HEIGHTS AND PLANAR FETS ON THE SAME SUBSTRATE

FIELD OF THE INVENTION

This invention relates generally to structures and methods for forming both planar and fin-type field effect transistors on a common substrate.

BACKGROUND OF THE INVENTION

It is known that high performance field effect transistors (FETs) can be formed in fin-like semiconductor structures, commonly referred to as "FIN-FETs". Integrated circuits (ICs) are fabricated using such FIN-FETS. Unlike conventional planar FETs, with FIN-FETs the semiconductor region containing the source-drain channel has a fin-like shape standing approximately perpendicular to the surface of the substrate die or wafer on which the device is formed. Gate electrodes can be provided on both exposed sides of the fin-like channel region and sometimes along the narrow top edge and even along the narrow bottom edge, although such edge gates are not required. The term "tri-gate" is used to refer to fin-type FETs that have the gate along the narrow top edge as well as along the sides. As used herein, the term "FIN-FET", singular or plural, is intended to include all such variations.

The channel width W of a FIN-FET is primarily determined by the height H of the fin above the supporting substrate multiplied by the number of fins electrically connected in parallel in the FIN-FET. For a single fin FIN-FET, W≈H and for a FIN-FET having j parallel connected fins, W≈j*H, j=1, 2, 3, ... N. The channel length L is substantially determined by the distance along the length of the fin(s), usually substantially parallel to the supporting substrate, between the source and drain where the opposing sides of the fin are covered by the gate electrode. Because of the distinctly different geometry of a FIN-FET compared to a planar FET, designing and constructing FIN-FETS and ICs embodying FIN-FETs to meet specific performance criteria present special challenges. These challenges are especially difficult when it is desired to form both multiple fin height FIN-FETs and planar FETs on the same substrate.

BRIEF SUMMARY OF THE INVENTION

An electronic device (20, 20') having a combination of fin-type (FIN) and planar field effect transistors (FETs) on a common substrate (21) is provided. The device includes a substrate (21) having a first portion (211) and a second portion (212), with a first FIN-FET (221) on the first portion (211) having a first fin height H1, with a second FIN-FET (222) on the first portion (211) having a second fin height H2≠H1, and with at least one planar field effect transistor (FET) (32, 32') on the second portion (212) of the substrate (21). The FIN-FETs (22) and planar FET (32, 32') are separated vertically as well as laterally which aids isolation therebetween. In further embodiments, improved isolation is provided by forming the planar FET (32) in a semiconductor region (441) insulated from the common substrate (21).

A method (800) is provided for forming a combination (20, 20') of fin-type (FIN) and planar field effect transistors (FETs) on a common substrate (21). A substrate (21) is provided with a first portion (211) and a second portion (212). A first semiconductor fin (231) of a first fin height H1 and a second semiconductor fin (232) of a second fin height H2≠H1 are formed on the first portion (211). The fins (231, 232) are adapted to have FIN-FETs (22) formed therein. At least one planar FET (32, 32') is formed on the second portion (212, 441, 214). Source regions (251, 252) and drain regions (271, 272) coupled to the fins (231, 232) are formed for the FIN-FETs (22). Source (351, 352) and drain regions (371, 372) are formed in the second portion (212, 441, 214) for the at least one planar FET (32, 32'). A first gate structures (24) is formed at least on opposed sides of the first (231) and second (232) fins for the FIN-FETs (22), and a second gate structure (34) is formed over the second portion (212, 441, 214) between the source (351, 352) and drain (371, 372) regions of the at least one planar FET (32, 32').

The ability to have both FIN-FETs and planar FETS on a common substrate while avoiding channel-width quantization effects through use of multiple height fins allows great design flexibility. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The invention will be better understood from a reading of the following detailed description, taken in conjunction with the accompanying figures in the drawings in which like numerals denote like or analogous elements, and wherein:

FIG. 1 shows a simplified plan view of a combination of FIN-FETs and planar FETs on a common substrate, according to an embodiment of the invention;

FIG. 2 shows a simplified cross-sectional view of the FIN-FETs and planar FETs of FIG. 1;

FIGS. 3-15 show simplified cross-sectional views of the FIN-FETs and planar FETs of FIGS. 1-2 being formed on a common substrate during various stages of manufacture, according to further embodiments of the invention;

FIG. 16 shows a simplified cross-sectional view analogous to that of FIG. 2 but of a combination of FIN-FETs and planar FETs according to a still further embodiment of the invention;

FIGS. 21-24 show simplified block diagrams of methods for fabricating the illustrative FIN-FETs and planar FETs of FIGS. 1-20 individually or as part of ICs, according to still yet further embodiments of the invention.

DETAILED DESCRIPTION OF THE INVENTION

Figure 5:
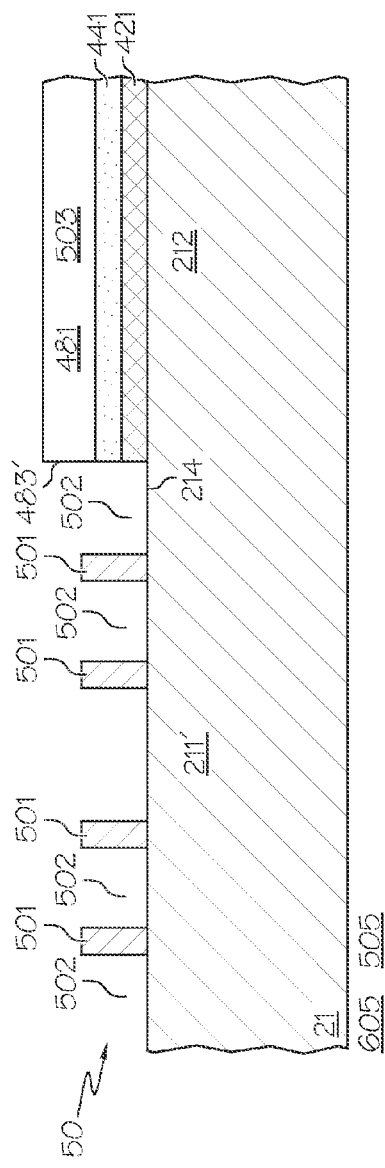

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. Furthermore, the terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein.

The drawings and associated discussion illustrate FIN FETs formed of semiconductor material on supporting substrates. As used herein, the term "semiconductor", singular or plural, is intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, insulating substrates, and combinations thereof such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but unless indicated otherwise by the particular context, the words "metal" and "conductor", singular or plural, should be interpreted broadly to include any type of electrical conductor, whether metallic or not. Semiconductors, doped semiconductors, metals, semi-metals, metal alloys, semiconductor-metal alloys and combinations thereof are non-limiting examples of useful electrical conductors. For convenience of explanation and not intended to be limiting, embodiments of the invention are described for FIN-FETs and planar FETs embodying silicon semiconductor material, but persons of skill in the art will understand based on the explanations herein that other semiconductor materials may also be used. The abbreviation "SC" is used herein for the terms "semiconductor" and "semiconductor material".

FIG. 1 shows a simplified plan view of combination 20 of FIN-FETs 22 and planar FETs 32 on common substrate 21, according to an embodiment of the invention, and FIG. 2 shows a simplified cross-sectional view of combination 20 of FIG. 1 at the location indicated on FIG. 1. FIGS. 1 and 2 are discussed together. In this example, combination 20 includes FIN-FETs 221, 222 (collectively 22) having fins 231, 232 (collectively 23) on which have been formed gate structures 241, 242 (collectively 24). FIN-FETs 22 overlie portion 211 of common substrate 21. FIN-FET 221 has two parallel coupled fins of height H1 and FIN-FET 222 has two parallel coupled fins of height H2<H1, but this is merely by way of example and such FIN-FETs may have any number of parallel coupled fins. Gate structures 24 include gate dielectrics 2411, 2421 and overlying gate conductors 2412, 2422. Gate structure 24 are separated from substrate 21 by dielectric layer or region 46 having upper surface 47. FIN-FETs 221, 222 have respectively, source regions 251, 252 (collectively 25) and drain regions 271, 272 (collectively 27) electrically coupled to fins 231, 232. To facilitate understanding, drain regions 271, 272 that lie behind the plane of the cross-section are shown in FIG. 2. Metal-SC alloy (e.g., silicide) source contact regions 261, 262 (collectively 26) are conveniently provided on source regions 25 and metal-SC alloy (e.g., silicide) drain contact regions 281, 282 (collectively 28) are conveniently provided on drain region 27. Fins 231, 232 stand approximately perpendicular to surface 213 of substrate 21. In the example of FIGS. 1 and 2, FIN-FETS 22 stand on surface 213 of semiconductor portion 211 of substrate 21, but this is not essential and in other embodiments, FIN-FETS 22 may be electrically separated from semiconductor portion 211 by a dielectric layer or a PN junction or a combination thereof.

Planar FETs 32 include first planar FET 321 and second planar FET 322 overlying dielectric layer or region 421 on surface 214 of portion 212 of common substrate 21. Planar FETs 321, 322 (collectively 32) are formed respectively in semiconductor regions 331, 332 (collectively 33) and have source regions 351, 352 (collectively 35) and drain regions 371, 372 (collectively 37) laterally separated by channel regions 361, 362 (collectively 36) respectively, underlying gate structures 341, 342, respectively (collectively (34). Metal-SC alloy (e.g., silicide) source contact regions 381, 382 (collectively 38) are conveniently provided on source regions 35 and metal-SC alloy (e.g., silicide) drain contact regions 391, 392 (collectively 39) are conveniently provided on drain regions 37. Gate structures 341, 342 (collectively 34) having gate dielectric layers 3411, 3421 with overlying gate conductors 3412, 3422 are conveniently provided over channel regions 361, 362. While planar FETs 321, 322 are shown as being formed in electrically separate SC region 331, 332 and are isolated from substrate 21 by dielectric layer or region 421, this is merely by way of illustration and not intended to be limiting. In a further embodiment, SC regions 331, 332 may be common. In a still further embodiment, dielectric layer or region 421 may be omitted and planar FETs 321, 322 formed in upper surface 214 of portion 212 of substrate 21, as shown for example in connection with FIGS. 16-20 to be discussed later. All such variations are useful. Further, in FIGS. 1-2, devices 221, 222, 321, 322 are shown as being electrically independent. However, any number of individual devices may be provided and combined in any manner needed to suit the particular electrical function being designed. Dielectric spacers conventionally provided on the lateral edges of gate structures 34 are omitted in FIGS. 1-2 and subsequent FIGS. in order to avoid cluttering the drawings, but persons of skill in the art will understand that such lateral gate edge dielectric spacers may be provided in other embodiments. All such variations are intended to be included.

It is highly desirable to be able to form both FIN-FETs and planar FETs on a common substrate. FIN-FETs and planar FETs can have significantly different electrical properties. Thus, by being able to form both types of devices on a common substrate the variety of integrated circuits (ICs) and other apparatus that can be formed and the capabilities of such ICs and apparatus are greatly enhanced. This greatly facilitates design flexibility so that electronic apparatus and integrated circuits of enhanced performance can be more readily provided. Further, the ability to form on such common substrate FIN-FETs having different fin heights and therefore able to have continuously variable FIN-FET channel widths, allows the channel width quantization effects encountered with FIN-FETs of uniform fin height to be avoided. This combination of advantages is very useful and of great practical importance.

FIGS. 3-15 show simplified cross-sectional views of FIN-FETs 22 and planar FETs 32 of FIGS. 1-2 being formed on common substrate 21 during various stages 503-515 of manufacture, according to further embodiments of the invention. Referring now to manufacturing stage 503 of FIG. 3, semiconductor (SC) substrate 21 having upper surface 214 is provided. Overlying surface 214 in this embodiment is dielectric layer 42 (e.g., of silicon oxide) of thickness 43 usefully in the range of about 5 to 200 nanometers, with about 20 to 100 nanometers being preferred, but larger and smaller thicknesses and other dielectrics may also be used. In this embodiment, overlying dielectric layer 42 is SC layer 44 of thickness 45 in which planar FETs 32 will subsequently be formed. Silicon is a non-limiting example of a suitable material for SC layer 44, but other SC materials may also be used. Thickness 45 is conveniently in the range of about 4 to 70 nanometers with about 5 to 50 nanometers being preferred, but larger and smaller thicknesses may also be used. Since parts of layer 44 can conveniently serve as the channel regions of planar FETs 32, the conductivity type, dopant concentration and thickness of layer 44 is desirably chosen according to the particular planar FET device properties that are desired. Such choices are within the competence of those of skill in the art. Structure 603 results. In still other embodiments, a further dielectric layer (not shown) may be provided overlying SC layer 44, but this is not essential. Either arrangement is useful.

Referring now to manufacturing stage 504 of FIG. 4, structure 603 is covered by mask 48 having closed portion 481 approximately in the location(s) desired for planar FETs 32 and open portion 482 approximately in the location(s) desired for FIN-FETs 22, and with lateral edge 483' therebetween. The portion of substrate 21 underlying mask opening 482 is identified by reference number 211' where the prime (') indicates that portion 211' is a precursor to substrate portion 211 illustrated in FIG. 2 and elsewhere, in which FIN-FETs 22 are subsequently formed. The portions of layer 42, 44 exposed under open portion 482 are removed, for example by anisotropic etching using means well known in the art, but any convenient removal technique may be employed, leaving behind on surface 214 of substrate 21, portions or regions 421, 441 of layers 42, 44 respectively. Structure 604 results.

In manufacturing stage 505 of FIG. 5, closed portion 481 of mask 48 may be removed from structure 604 or left in place. Mask 50 is provided having closed portions 501 and open portions 502. Closed portion 503 is also indicated in FIG. 5 in the event that portion 481 of mask 48 has been removed, since it serves the same function of protecting layer portions or regions 441, 421. Closed portions 501 of mask 50 correspond substantially to the location and lateral thickness or width of fins 231, 232, etc., and opening portions 502 correspond substantially to the lateral spacing or separation of fins 231, 232, etc., to be subsequently formed on substrate 21. Structure 605 results.

Figure 6:
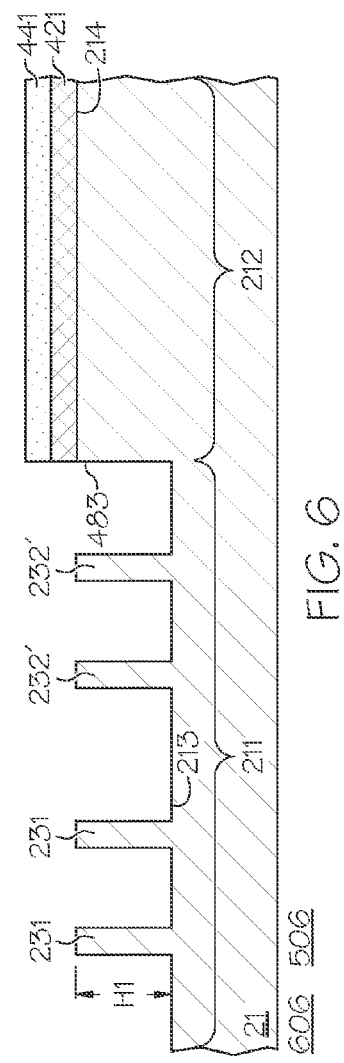

In manufacturing stage 506 of FIG. 6, structure 605 is, for example, anisotropically etched to define fins 231, 232' of height H1 standing substantially upright on surface 213 of recessed portion 211 of SC substrate 21. Height H1 is chosen depending on the channel width W desired for FIN-FETs 22. After mask 50 (and mask 481 if previously left in place) is removed, structure 606 results. Persons of skill in the art will understand that any number of fins or groups of fins may be formed in manufacturing stages 505, 506 and having any desired height H1 above recessed surface 213 of portion 211 of substrate 21. The formation of only two groups of fins 231, 232' of two fins each is illustrated in FIGS. 5 and 6 merely for convenience and not intended to be limiting. Fins 232' are designated with a prime (') to indicate that such fins are precursors to fins 232 of fin height H2 shown in FIGS. 1-2 and elsewhere.

Figure 7:
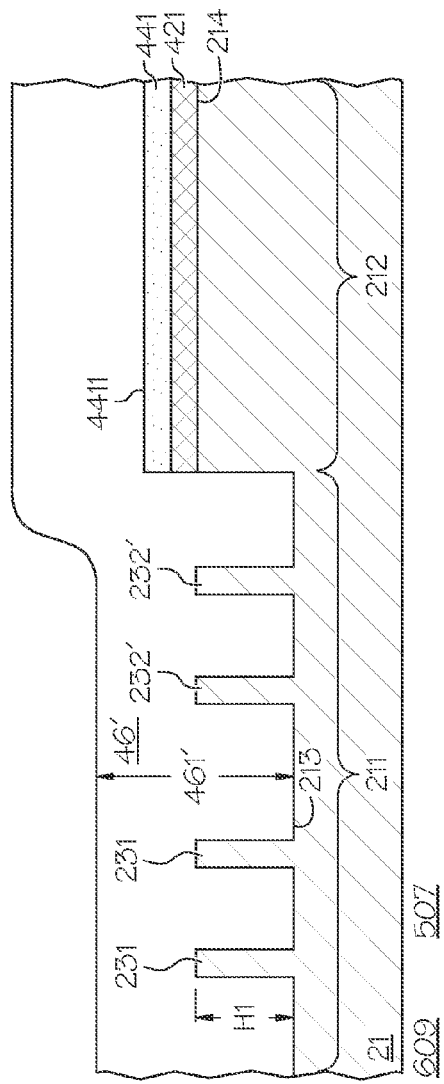

Referring now to manufacturing stage 507 of FIG. 7, dielectric material 46' of thickness 461' is provided over structure 606 of FIG. 6. Thickness 461' is desirably chosen to be at least equal to height H1. Silicon oxide is a non-limiting example of a suitable dielectric material, but other dielectric materials may also be used. Structure 607 results. In manufacturing stage 508 of FIG. 8, structure 607 is substantially planarized to re-expose upper surface 4411 of SC layer portion or region 441. Chemical-mechanical-polishing (CMP) is a suitable planarization method, but other planarization techniques known in the art may also be used. Structure 608 results. In manufacturing stage 509 of FIG. 9, dielectric material 46' of structure 608 is selectively etched so as to leave SC fins 23 and SC layer portion 441 substantially untouched while dielectric material 46' is selectively removed to leave dielectric layer or region 46 of thickness 461 on surface 213 of recessed portion 211 of substrate 21 substantially laterally surrounding SC fins 23. Dielectric layer or region 46 has upper surface 47. Thickness 461 is usefully in the range of about 10 to 50 nanometers with about 10 to 30 nanometers being preferred, but thicker and thinner layers may also be used. SC fins 23 protrude from dielectric layer 46 by height H1'<H1, where H1'~H1 less thickness 461. Thus, both H1 and thickness 461 may be used to fine tune the net fin height H1'. Structure 609 results.

In order to have FIN-FETs 22 of different fin heights on the same substrate as planar FETs 32, it is desirable to shorten the heights of, for example, fins 232' while leaving height H1 of fins 231 substantially unchanged. This may be accomplished in several ways. Referring now to manufacturing stage 510 of FIG. 10, mask 60 is applied having closed portions 601 and open portion 602, where open portion 602 overlies the location of fins 232'. Photo-resist is a non-limiting example of a suitable material for mask 60, but other SC etch-resistant materials may also be used. In one embodiment, fins 232' exposed in opening 602 are selectively etched, preferably anisotropically, to remove portions 62 thereof, leaving behind shortened fins 232 of height H2 above surface 213 of recessed portion 211 of substrate 21.

In a preferred embodiment, portion 62 of fins 232' are subjected to Implant A to depth D of etch rate altering ions, thereby changing the chemical composition and etch rate of depth D of portion 62 of fins 232'. It has been found that where fins 232' are of silicon, germanium is a suitable etch rate altering material in doses exceeding about 1E15 ions/cm$^{-2}$, or stated another way, for germanium concentrations exceeding about 1E20 ions/cm$^{-3}$. Other etch rate altering ions and doses or concentrations may also be used. Structure 610 results.

Figure 11:
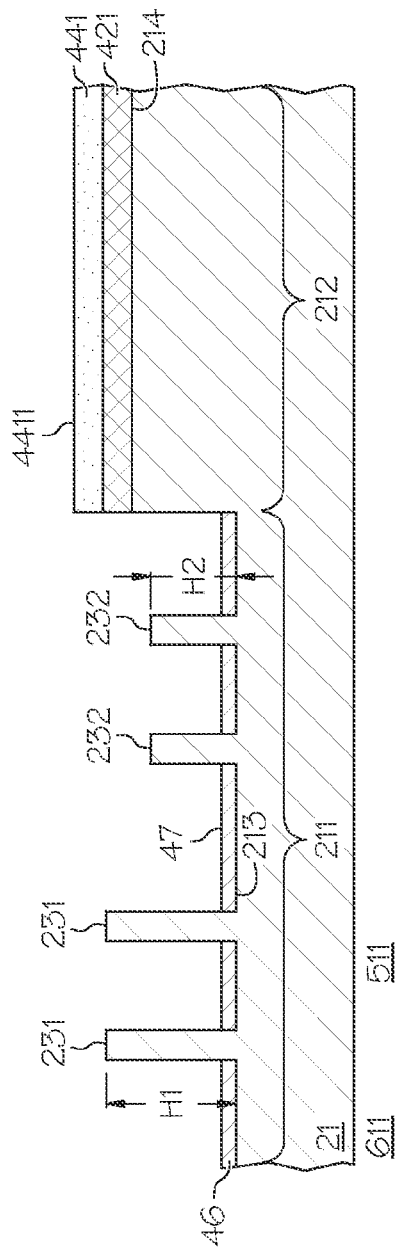

In manufacturing stage 511 of FIG. 11, with or without removing mask 60, structure 610 is subjected to selective etching to remove Ge doped Si portion 62 of depth D on fins 232' of structure 610, thereby providing structure 611 of FIG. 11, wherein shortened fins of height H2 above surface 213 of recessed portion 211 of substrate 21 are obtained. Hydrochloric (HCl) vapor etch is a non-limiting example of a suitable etchant for removing germanium doped silicon. By either of the above-described means, shortened fins 232 are obtained. Persons of skill in the art will understand that the procedure illustrated in connection with FIGS. 10-11, may be repeated for as many different fins or groups of fins of different heights Hi (i=2, 3, 4, . . . n) as are desired to be included in the particular device or circuit being fabricated. Channel width quantization effects that result when only single height fins are available are thereby avoided. Thus, the ability to provide FIN-FETS 22 of various fin heights on the same substrate as associated planar devices can be accomplished and furthermore, as is explained below, in a manner compatible with the formation of planar FETs 32, 32' on the same substrate.

Figure 12:
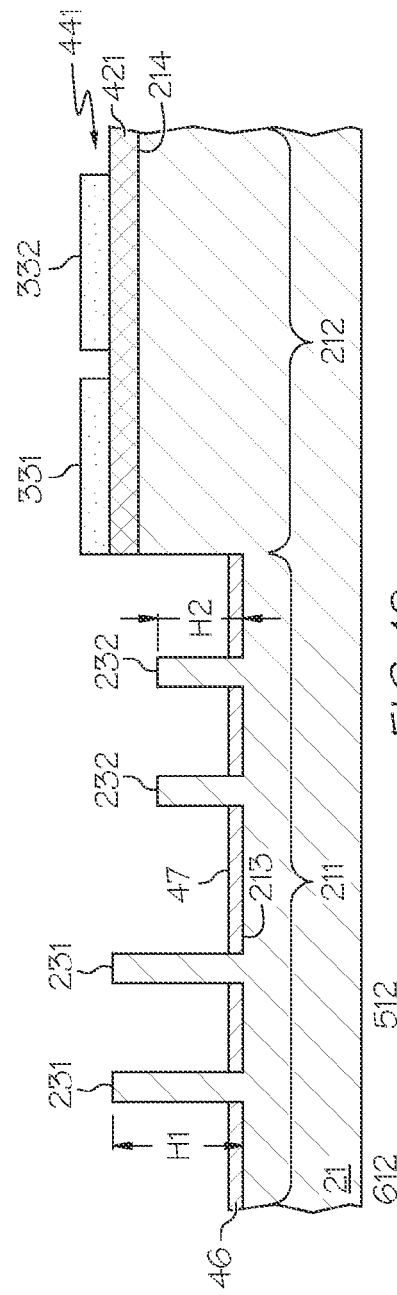
Figure 17:
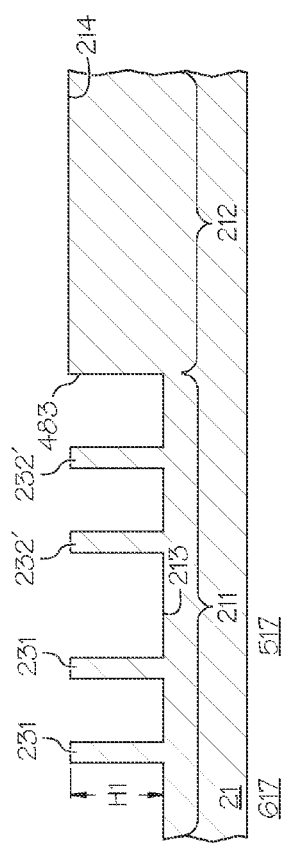
FIGS. 17-20 show simplified cross-sectional views analogous to those of FIGS. 3-15 of FIN-FETs and planar FETs being formed on a common substrate during various stages of manufacture, according to yet further embodiments of the invention.
Figure 18:
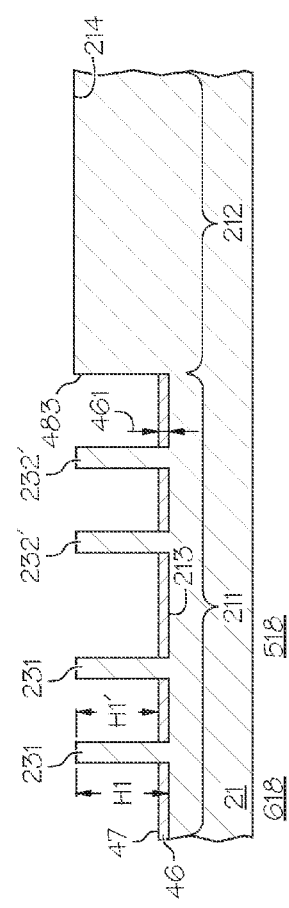
Figure 19:
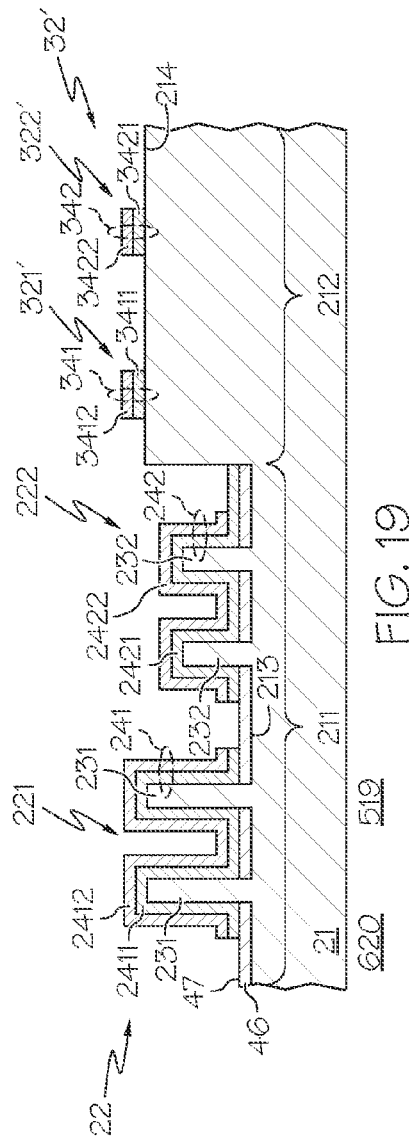
Figure 20:
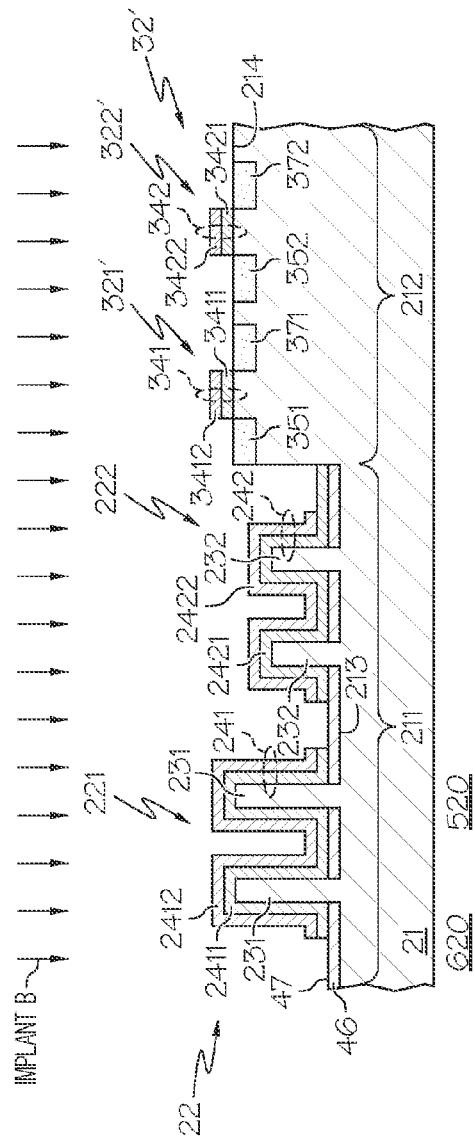

Referring now to manufacturing stage 512 of FIG. 12, structure 611 is conveniently masked and etched to define planar SC regions 331, 332 from SC layer portion or region 441 on dielectric layer portion or region 421 over portion 212 of substrate 21. Manufacturing stage 512 is optional depending on whether planar FETs 32 of FIGS. 1-2 are desired to be formed in separate SC regions (e.g., regions 331, 332) or incorporated in common region 441 or some combination thereof depending upon the desired number and function of the planar FETs being included. Structure 612 results.

As will be understood by those of skill in the art, the source, drain, contact and gate structures associated with FIN-FETs 22 and planar FETs 32 may be formed in various orders according to the capabilities of the fabrication facility being used. Any such arrangement may be used. Manufacturing stages 513-515 of FIGS. 13-15 illustrate a particular order but are intended merely to illustrate a useful sequence and not to be limiting. Thus, the formation of gate structures 241, 242 (collectively 24) and 341, 342 (collectively 34) illustrated in FIG. 13 and the formation of source-drain regions 251, 271; 252, 272 and 351, 371; 352, 372 illustrated in FIG. 14 (see also FIG. 1), and the formation of source-drain contact regions 261, 281; 262, 282 and 381, 391; 382, 392 illustrated in FIG. 15 (see also FIGS. 1-2) may be performed in any convenient order, and in yet other embodiments, may be performed separately or together for FIN-FETs 22 and planar FETs 32 or combinations thereof. The particular order will depend on the particular devices being formed and the capabilities of the manufacturing line being used and is within the capability of those of skill in the art. All such variations are intended to be included.

Referring now to manufacturing stage 513 of FIG. 13 (and FIG. 1), gate structures 241, 242 (collectively 24) including gate dielectric 2411, 2421 and gate conductor 2412, 2422 are formed over fins 231, 232, and gate structures 341, 342 (collectively 34) including gate dielectric 3411, 3421 and gate conductor 3412, 3422 are formed over planar SC regions 331, 332. Techniques for forming such gate structures are well known in the art. Structure 613 results (a plan view is provided in FIG. 1). Referring now to manufacturing stage 514 of FIG. 14 (see also FIG. 1), source-drain regions 251, 252; 271, 272 are formed in communication with fins 231, 232 of FIN-FETS 22, and source-drain regions 351, 352; 371, 372 are formed in communication with channel regions 361, 362 of planar FETs 32, as for example by Implant B. Structure 614 results (a plan view is provided in FIG. 1). Referring now to manufacturing stage 515 of FIG. 15 (see also FIG. 1), source-drain contact regions 261, 262; 281, 282 are formed in communication with source-drain regions 251, 252; 271, 272 of FIN-FETS 22, and source-drain contact regions 381, 382; 391, 392 are formed in communication with source-drain regions 351, 352; 371, 372 of planar FETs 32. Structure 615 results (a plan view is provided in FIG. 1). To facilitate understanding, drain regions 271, 272 are shown in FIGS. 2 and 14 and drain regions 271, 272 and drain contact regions 281, 282 are shown in FIGS. 2 and 15. These lie behind the plane of the cross-section indicated in FIG. 1. Various dielectric passivation and interconnection layers may be further provided for the structures illustrated in FIGS. 1-2 and 15 to interconnect the illustrated devices in whatever combinations are needed to achieve the desired circuit capability. Such "back-end" manufacturing operations are well known and within the competence of those of skill in the art.

FIG. 16 shows a simplified cross-sectional view analogous to that of FIGS. 2 and 15 but of combination 20' of FIN-FETs 22 and planar FETs 32' according to a still further embodiment of the invention. The same or analogous reference numbers are used in FIG. 16 as in FIGS. 1-2 and 15 to identify the various device regions. The plan view of FIG. 1 also corresponds generally to the cross-section of FIG. 16. FIN-FET and planar FET combination 20' of FIG. 16 differs from combination 20 of FIGS. 1-2 and 15 in that in combination 20', planar FETs 321', 322' (collectively 32') analogous to planar FETS 321, 322 (collectively 32) of FIGS. 1-2 and 15 are formed in upper surface 214 of portion 212 of substrate 21 rather than in SC layer portion or region 441 as shown in FIGS. 1-2 and 3-15. For convenience of explanation, the same reference numbers are used to identify source-drain regions 351, 352; 371, 372 and contact regions 381, 382; 391, 392 and gate structures 341, 342 and further details of gate structures 341, 342 in FIGS. 1-2, 14-15 and 16. The discussion of such regions in connection with FIGS. 1-2 and 14-15 is incorporated herein by reference. Further information concerning the formation of device combination 20' of FIG. 16 is provided in connection with FIGS. 17-20.

Figure 8:
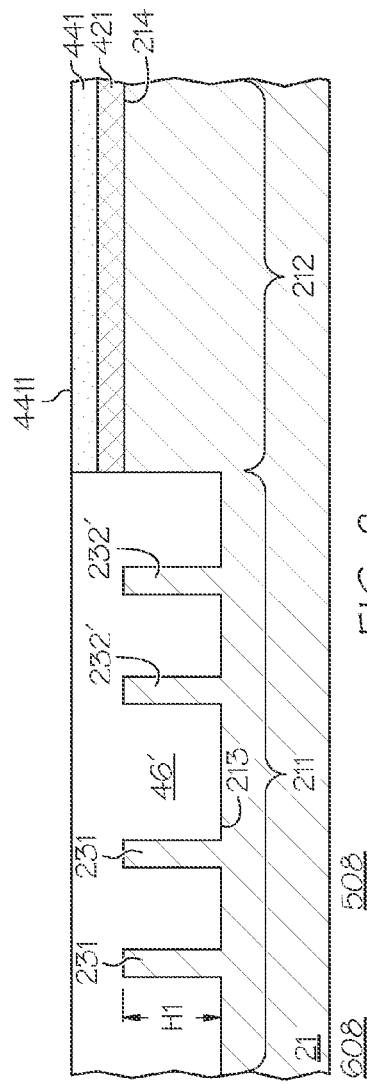

FIGS. 17-20 show simplified cross-sectional views analogous to those of FIGS. 3-15 of FIN-FETs 22 and planar FETs 32' being formed on common substrate 21 during various stages 517-520 of manufacture, according to yet further embodiments of the invention. Because many of the stages of manufacture of combination 20' of FIN-FETs 22 and planar FETs 32' on common substrate 21 are similar to those employed in connection with combination 20, except for the omission of layers 42, 44 in FIGS. 17-20, a more limited representation of the various manufacturing stages is provided with respect to the formation of combination 20' of FIG. 16 and the relevant portions of the discussion of FIG. 3-15 are incorporated herein by reference. In manufacturing stage 517 of FIG. 17, manufacturing stages equivalent to those represented in FIGS. 3-6 are provided but with layers 42, 44 and layer portions or regions 421, 441 omitted. Structure 617 of FIG. 17 results. In connection with manufacturing stage 518 of FIG. 18, manufacturing stages analogous to those illustrated in FIGS. 7-9 are provided, except that layers 42, 44 and layer portions or regions 421, 441 are omitted. Structure 618 of FIG. 18 results. Following manufacturing stage 518 of FIG. 18, in manufacturing stage 519 of FIG. 19 manufacturing stages analogous to those illustrated in FIGS. 10-11 and 13 are performed, but without layer portions or regions 421, 441, resulting in structure 619 of FIG. 19 wherein gate structures 342, 343 of planar FETs 321', 322' are provided. In manufacturing stage 520 of FIG. 20, Implant B analogous to that used in the manufacturing stage of FIG. 14 is provided, resulting in structure 620 wherein source-drain regions 351, 352; 371, 372 are formed in connection with planar FETs 32', and preferably but not essentially as well as those associated with FIN-FETs 22 as has been described in connection with FIG. 14. By providing a manufacturing stage analogous to that illustrated in FIG. 15, but without layer portions or regions 421, 441, source-drain contact regions 381, 382; 391, 392 are provided analogous to those in FIG. 15, resulting in combination structure 20' of FIN-FETs 22 and planar FETs 32' shown in FIG. 16. Thus, FIGS. 16-20 illustrate that combination 20' of FIN-FETs 22 and planar FETs 32' may be formed on common substrate 21 according to still further embodiments of the invention, wherein planar FETs 32' are formed directly in substrate 21 rather than in SC layer portion or region 441 isolated from substrate 21 by dielectric layer portion or region 421. Either arrangement is useful. In combination 20 of FIG. 2, planar FETs 32 are electrically isolated from FIN-FETs 22 by dielectric layer portion or region 421. This can be very useful in certain application. However, even in combination 20' of FIG. 16, where FIN-FETs 22 and planar FETs 32' reside on the same SC substrate, some degree of electrical isolation is provided by the fact that planar FETs 32' are formed in mesa portion 212 of substrate 21, separated at least by vertical distance H2 and approximately by vertical distance H1 from surface 213 supporting FIN-FETs 22. Stated another way, FIN-FETs 22 and planar FETs 32' are separated by combined lateral and vertical path 70, which path provides useful isolation even in circumstances when including an isolating dielectric (e.g., region 421) beneath planar FETs 32' is not desired. In still other embodiments, one or more PN junctions 75 (see FIG. 16) may be provided in portion 212 underlying planar FETs 32' to increase the electrical isolation of planar FETs 32' from FIN-FETs 22. All such variations are useful.

FIGS. 21-24 show simplified block diagrams of method 800 for fabricating on a common substrate (21) a combination (20, 20') of FIN-FETs (22) and planar FETs (32, 32') of FIGS. 1-20 individually or as part of an IC or other electrical apparatus, according to still yet further embodiments of the invention. Method 800 begins with START 801 and initial block 802 wherein there is provided a substrate (21) with a first portion (211) having thereon a first semiconductor fin (231) of a first height H1 and a second semiconductor fin (232) of a second fin height H2≠H1, the fins (231, 232) adapted to have FIN-FETs (22) formed therein, and with a second portion (212, 441, 214) adapted to have at least one planar FET (32, 32') formed therein. The term "therein" as used herein and in the claims that follow in reference to the location of the at least one planar FET, is intended to include both the arrangements illustrated in FIGS. 2 and 16, that is, both the situation where planar FET 32 is formed in SC layer or region 441 above surface 214 as shown in FIGS. 2 and 15 and the situation where planar FET 32' is formed in surface 214 as shown in FIG. 16.

In block 804, there are provided in any desired order: source regions (251, 252) and drain regions (271, 272) coupled to the fins (231, 232) for the FIN-FETs (22), source (351, 352) and drain regions (371, 372) in the second portion (212, 441, 214) for the at least one planar FET (32, 32'), a first gate structures (24) at least on opposed sides of the first (231) and second (232) fins for the FIN-FETs (22), and a second gate structure (34) over the second portion (212, 441, 214) between the source (351, 352) and drain (371, 372) regions of the at least one planar FET (32, 32'). These activities may be performed in various orders depending, among other things, on the capability of the manufacturing facility being used and the particular devices or ICs being fabricated. Persons of skill in the art will understand how to arrange the sequence of actions to best suit their needs. It will be understood by those of skill in the art that various metallization and passivation steps common in the art may be performed during or after the fabrication stages described herein. Method 800 then proceeds to END 806.

As noted earlier, the source (251, 252) and drain (351, 352) regions of the FIN-FETs (22) and the source (351, 352) and drain regions (371, 372) of the at least one planar FET (32, 32') may be provided separately or substantially at the same time or in related manufacturing stages in various embodiments. Similarly, the first gate structures (24) and the second gate structure (34) may be provided separately or substantially at the same time or in related manufacturing stages in various other embodiments. All such variations are intended to be included. The result is a device or integrated circuit combination (20, 20') having at least two FIN-FETs (221, 222) having different fin heights H2≠H1 (and therefore different channel widths W2≠W1) and one or more planar FETs (32, 32') on a common substrate (21). As has been explained, fin heights H2≠H1 and therefore channel widths W2≠W1 may be otherwise chosen independently, and as many fins as are desired may be provided in parallel in the various FIN-FETs while still avoiding the channel width quantization problems associated with FIN-FETs that have uniform fin heights. Further by being able to provide such highly flexible FIN-FETs on the same substrate with planar FETs, great design flexibility is obtained, leading to devices and ICs of superior performance. This is a highly desirable feature not provided in the prior art.

FIGS. 22-24 provide further details concerning the first portion recited in block 802 of method 800. Referring now to FIG. 22, wherein block 802 has sub-blocks 802-1 and 802-2. In block 802-1, there is provided a substrate (21) having a first portion (211) on which are formed any number of first semiconductor (SC) fins (231) and any number of initial SC second fins (232') of substantially uniform height H1. In block 802-2, the initial second SC fins (232') are shortened from initial height H1 to have second fin height H2<H1. Method 800 with the first portion (211) modified in blocks 802-1, 802-2 along with the second portion (212) recited in block 802, then proceeds to block 804 as indicated in FIG. 22.

In FIG. 23, further details are provided concerning block 802-1 that has sub-blocks 802-21 and 802-22. In sub-block 802-21, as has been previously described, the etch rate of the initial second fins (232') is altered to depth D~H1-H2 and in sub-block 802-22, the initial second fins (232') are differentially etched to substantially remove amount D to obtain the second fins of second fin height H2. The first portion (211) modified as described in blocks 802-21 and 802-22 along with the second portion (212) recited in 802 then proceeds to block 804 as indicated in FIGS. 22, 23.

In FIG. 24, further details are provided concerning block 802-21 that has sub-blocks 802-211 and 802-212. In sub-block 802-211, a mask is applied over the fins (231, 232') having an opening (602) in which the initial second fins (232') of initial height H1 are exposed, and in block 802-212, etch rate enhancing ions are implanted into the initial second fins (232') to depth D~H1-H2. The first portion (211) modified as indicated in blocks 802-211 and 802-22 then proceeds to block 802-22 of FIG. 23 and from block 802-22 along with the second portion (212) recited in block 802, proceeds to block 804 as indicated in FIGS. 22, 23.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. An electronic device having a combination of fin-type (FIN) and planar field effect transistors (FETs), comprising:

a common semiconductor substrate having a first portion and a second portion;

a first FIN-FET extending from a first surface of the first portion and having a first fin height H1;

a second FIN-FET extending from the first surface of the first portion and having a second fin height H2≠H1, wherein fins from the first and second FIN-FET extend from the first surface of the first portion of the common semiconductor substrate, and wherein fins from the first and second FIN-FET are electrically connected through the common semiconductor substrate; and at least one planar field effect transistor (FET) on the second portion of the common semiconductor substrate.

2. The electronic device of claim 1, wherein the first and second FIN-FETs and the planar FET are laterally separated on the substrate.

3. The electronic device of claim 1, wherein at least some of the fins of the first and second FIN-FETs, and the planar FET, are vertically separated on the common semiconductor substrate.

4. The electronic device of claim 1, wherein:

the at least one planar FET is formed in or over a second surface of the second portion of the common semiconductor substrate; and the first and second surfaces are vertically separated.

5. The electronic device of claim 4, wherein, the first and second surfaces are vertically separated by about height H1.

6. The electronic device of claim 1, wherein the at least one planar FET is electrically isolated from the second portion of the common semiconductor substrate by a first dielectric region.

7. The electronic device of claim 6, wherein the planar FET is formed in a semiconductor region overlying the first dielectric region.

8. The electronic device of claim 1, wherein the planar FET is formed in or on a semiconductor surface of the second portion of the common semiconductor substrate.

9. The electronic device of claim 8, wherein the planar FET is electrically isolated from the first and second FIN-FETs by one or more PN junctions.

10. The electronic device of claim 1, wherein:

fins of the first and second FIN-FETs are spaced apart; and parts of the first surface lying laterally between the fins are covered by a second dielectric region.

11. The electronic device of claim 10, wherein portions of gate electrodes of the first or second FIN-FETs are separated from the first surface by the second dielectric region.

12. The electronic device of claim 1, wherein one or more of the first or second FIN-FETs comprise multiple parallel coupled fins.

13. An electronic device having a common semiconductor substrate, comprising:

multiple FIN-FETS extending from a first surface of a first portion of the common semiconductor substrate, having at least first and second fin heights H1, H2 wherein H2<H1, wherein the multiple FIN-FETS comprise multiple fins that extend from the first portion of the common semiconductor substrate such that the multiple fins are electrically connected through the common semiconductor substrate; and a planar FET on a second portion of the common semiconductor substrate.

14. The electronic device of claim 13, wherein the planar FET lies in or over a second surface of the common semiconductor substrate and the first and second surfaces are vertically separated by at least height H2.

15. The electronic device of claim 14, wherein the planar FET is separated from the second surface by a dielectric region.

16. The electronic device of claim 14, wherein the planar FET is adapted to form a channel region proximate the second surface.

17. The electronic device of claim 14, wherein the planar FET is adapted to form a channel region in a semiconductor region above the second surface.

* * * * *